United States Patent
Kusuda (10) Patent No.: US 11,228,291 B2
(45) Date of Patent: Jan. 18, 2022

(54) CHOPPER AMPLIFIERS WITH MULTIPLE SENSING POINTS FOR CORRECTING INPUT OFFSET

(71) Applicant: Analog Devices, Inc., Norwood, MA (US)

(72) Inventor: Yoshinori Kusuda, San Jose, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/929,815

(22) Filed: May 22, 2020

(65) Prior Publication Data
US 2021/0367569 A1    Nov. 25, 2021

(51) Int. Cl.
| | | |
|---|---|---|
| *H03F 1/02* | (2006.01) | |
| *H03F 3/387* | (2006.01) | |
| *H03F 3/45* | (2006.01) | |
| *H03F 1/30* | (2006.01) | |

(52) U.S. Cl.
CPC .......... *H03F 3/387* (2013.01); *H03F 1/303* (2013.01); *H03F 3/45475* (2013.01); *H03F 2200/375* (2013.01)

(58) Field of Classification Search
CPC .............. H03F 3/387; H03F 2200/375; H03F 3/45475; H03F 1/303; H03F 3/005
USPC ............................................................ 330/9
See application file for complete search history.

(56) References Cited

U.S. PATENT DOCUMENTS

| | | | |
|---|---|---|---|
| 6,380,801 B1 | 4/2002 | Mccartney | |
| 6,734,723 B2 | 5/2004 | Huijsing et al. | |
| 7,209,000 B2 * | 4/2007 | Huijsing | H03F 1/08 327/124 |
| 7,295,061 B1 | 11/2007 | Dasgupta | |

(Continued)

FOREIGN PATENT DOCUMENTS

| | | |
|---|---|---|
| CN | 106972834 A | 7/2017 |
| CN | 108494370 A | 9/2018 |

(Continued)

OTHER PUBLICATIONS

Fan et al., "A 21 nV/ PHz Chopper-Stabilized Multi-Path Current-Feedback Instrumentation Amplifier with 2 μV Offset" IEEE Journal of Solid-State Circuits, vol. 47, No. 2, Feb. 2012 in 12 pages.

(Continued)

*Primary Examiner* — Khanh V Nguyen
(74) *Attorney, Agent, or Firm* — Knobbe, Martens, Olson & Bear, LLP (57) ABSTRACT

Chopper amplifiers with multiple sensing points for correcting input offset are disclosed herein. In certain embodiments, a chopper amplifier includes chopper amplifier circuitry including an input chopping circuit, an amplification circuit, and an output chopping circuit electrically connected in a cascade along a signal path. The chopper amplifier further incudes a multi-point sensed offset correction circuit that generates an input offset compensation signal based on sensing a signal level of the signal path at multiple signal points. Furthermore, the multi-point sensed offset correction circuit injects the input offset compensation signal into the signal path to thereby compensate for input offset voltage of the amplification circuit while suppressing output chopping ripple from arising.

20 Claims, 9 Drawing Sheets

(56) References Cited

U.S. PATENT DOCUMENTS

| | | |
|---|---|---|
| 7,764,118 B2 | 7/2010 | Kusuda et al. |
| 7,973,596 B2 | 7/2011 | Eschauzier et al. |
| 8,120,422 B1 | 2/2012 | Huijsing et al. |
| 8,179,195 B1 | 5/2012 | Huijsing et al. |
| 8,786,363 B2 * | 7/2014 | Ahmad .............. H03F 3/4595 330/69 |
| 8,829,988 B2 | 9/2014 | Motz et al. |
| 9,294,049 B2 * | 3/2016 | Huijsing .............. H03F 1/56 |
| 9,564,859 B2 | 2/2017 | Ivanov et al. |
| 9,614,481 B2 * | 4/2017 | Ivanov .............. H03F 1/0205 |
| 9,729,109 B2 | 8/2017 | Shu et al. |
| 10,003,306 B1 | 6/2018 | Larson et al. |
| 10,116,268 B2 | 10/2018 | Vijaykumar et al. |
| 10,411,664 B2 | 9/2019 | Stanescu et al. |
| 2009/0115522 A1 | 5/2009 | Lyden et al. |
| 2009/0278597 A1 | 11/2009 | Zhang et al. |
| 2013/0335131 A1 | 12/2013 | Ceballos et al. |
| 2013/0335141 A1 | 12/2013 | Ahmad |
| 2015/0207477 A1 | 7/2015 | Stanescu |
| 2016/0006403 A1 | 1/2016 | Ivanov et al. |
| 2016/0056707 A1 | 2/2016 | Wong et al. |
| 2018/0198417 A1 | 7/2018 | Vijaykumar et al. |
| 2019/0079143 A1 | 3/2019 | Romero et al. |
| 2019/0158034 A1 | 5/2019 | Sloboda et al. |

FOREIGN PATENT DOCUMENTS

| | | |
|---|---|---|
| EP | 2327153 B1 | 4/2017 |
| WO | WO2019170237 A1 | 9/2019 |

OTHER PUBLICATIONS

Kusuda, Delft University of Technology, "Reducing Switching Artifacts in Chopper Amplifiers" 2018 in 209 pages.

Kusuda, IEICE Transactions on Electronics, "Techniques of Reducing Switching Artifacts in Chopper Amplifiers" dated Apr. 9, 2020 in 9 pages.

Moghimi, Analog Devices, Inc. To Chop or Auto-Zero: That Is the Question (Technical Article MS-2062) dated Jun. 2011 in 6 pages.

Wu, et al., "A Chopper Current-Feedback Instrumentation Amplifier with a 1 mHz 1/f Noise Corner and an AC-Coupled Ripple Reduction Loop", IEEE J. Solid-State Circuits, vol. 44, No. 12, pp. 3232-3243, Dec. 2009 in 12 pages.

Extended European Search Report for International Application No. 21174088.1 dated Oct. 15, 2021, in 13 pages.

Wu, et al., "A Chopper Current-Feedback Instrumentation Amplifier with a Gain Error Reduction Loop and 0.06% Untrimmed Gain Error", IEEE Journal of Solid-State Circuits, vol. 46, No. 12, dated Dec. 2011, in 13 pages.

* cited by examiner

CHOPPER AMPLIFIERS WITH MULTIPLE SENSING POINTS FOR CORRECTING INPUT OFFSET

FIELD OF THE DISCLOSURE

Embodiments of the invention relate to electronic systems, and more particularly, to amplifiers.

BACKGROUND

An amplifier, such as an operational or instrumentation amplifier, can include chopper circuitry to help compensate for the amplifier's input offset voltage. For example, a chopper amplifier can include an input chopping circuit that can be used to chop the amplifier's input signal during an input chopping operation, thereby up-shifting the frequency of the amplifier's input signal. The chopper amplifier can further include an amplification circuit for amplifying the chopped input signal, and an output chopping circuit for down-shifting the frequency of the amplified signal during an output chopping operation. By providing chopping in this manner, the amplifier's input offset voltage is separated in frequency from the chopped input signal, and thus can be filtered or otherwise attenuated.

SUMMARY OF THE DISCLOSURE

Chopper amplifiers with multiple sensing points for correcting input offset are disclosed herein. In certain embodiments, a chopper amplifier includes chopper amplifier circuitry including an input chopping circuit, an amplification circuit, and an output chopping circuit electrically connected in a cascade along a signal path. The chopper amplifier further incudes a multi-point sensed offset correction circuit that generates an input offset compensation signal based on sensing a signal level of the signal path at multiple signal points. Furthermore, the multi-point sensed offset correction circuit injects the input offset compensation signal into the signal path to thereby compensate for input offset voltage of the amplification circuit while suppressing output chopping ripple from arising.

In one aspect, a chopper amplifier with chopping ripple suppression is provided. The chopper amplifier includes chopper amplifier circuitry including an input chopping circuit configured to chop an input signal to generate a chopped input signal, an amplification circuit configured to amplify the chopped input signal to generate an amplified signal, and an output chopping circuit configured to chop the amplified signal to generate a chopped output signal. The input chopping circuit, the amplification circuit, and the output chopping circuit are connected along a signal path through the chopper amplifier circuitry. The chopper amplifier further includes a multi-point sensed offset correction circuit configured to generate an input offset compensation signal for the chopper amplifier circuitry based on sensing the signal path at two or more signal points.

In another aspect, a method of amplification with suppressed chopping ripple is provided. The method includes chopping an input signal to generate a chopped input signal using an input chopping circuit, amplifying the chopped input signal to generate an amplified signal using an amplification circuit, chopping the amplified signal to generate a chopped output signal using an output chopping circuit that is connected with the input chopping circuit and the amplification circuit along a signal path, sensing the signal path at two or more signal points using a multi-point sensed offset correction circuit, and compensating the amplification circuit for an input offset using an input offset compensation signal generated by the multi-point sensed offset correction circuit.

In another aspect, a chopper amplifier is provided. The chopper amplifier includes a pair of input terminals, and chopper amplifier circuitry including an input chopping circuit including an input coupled to the pair of input terminals, an amplification circuit including an input coupled to an output of the input chopping circuit, and an output chopping circuit including an input coupled to an output of the amplification circuit. The input chopping circuit, the amplification circuit, and the output chopping circuit are connected along a signal path through the chopper amplifier circuitry. The chopper amplifier further includes a multi-point sensed offset correction circuit configured to generate an input offset compensation signal based on sensing the signal path at two or more signal points, and to compensate for an input offset of the amplification circuit by providing the input offset compensation signal to the output of the amplification circuit.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Absent compensation, an amplifier can have an input offset voltage and/or low frequency noise, such as flicker or 1/f noise having an associated noise power spectral density (PSD) that becomes larger at lower frequencies.

To reduce or remove input offset voltage and/or low frequency noise, an amplifier can include chopper circuitry. An amplifier with chopper circuitry is referred to as a chopper amplifier. In one example, a chopper amplifier includes an input chopping circuit that chops or modulates the amplifier's input signal during an input chopping operation, thereby up-shifting the frequency of the amplifier's input signal. Furthermore, the chopper amplifier includes an amplification circuit that amplifies the chopped input signal, and an output chopping circuit that chops or demodulates the amplified signal during an output chopping operation. By providing chopping in this manner, the amplifier's input offset voltage and/or low frequency noise is separated in frequency from the desired signal, and thus can be filtered or otherwise attenuated.

In certain implementations, a chopper amplifier can further include autozero circuitry. Including both autozero and chopper circuitry in a chopper amplifier can further lower overall input offset voltage and/or low frequency noise. The teachings herein are applicable not only to chopper amplifiers that provide chopping, but also to chopper amplifiers that combine chopping with autozeroing and/or other compensation schemes.

An amplifier's chopping operations can result in ripple appearing in the amplifier's output voltage. The chopping ripple can have a magnitude that changes in relation to the magnitude of the amplifier's input offset voltage and/or low frequency noise. Thus, chopping may result in the amplifier's input offset voltage and/or low frequency noise not being cancelled, but instead being modulated up by the chopping frequency to generate chopping ripple that corrupts the spectral integrity of the amplifier's output signal.

Although a low-pass post filter can be included after the output chopping circuit to filter chopping ripple associated with modulated input offset voltage and/or modulated low frequency noise, it can be desirable to reduce the amplifier's input offset voltage and/or low frequency noise to avoid a need for a post filter or to relax a design constraint of the post filter. In another example, a switched capacitor notch filter can be included after the output chopping circuit to provide attenuation of chopping ripple.

Feedback or feedforward correction paths can also be used to suppress chopping ripple. However, certain feedback or feedforward correction paths can cause signal distortion by introducing anomalies in the amplifier's frequency response characteristics. For example, certain chopping ripple suppression schemes may result in the appearance of notches near the chopping frequency in a plot of the amplifier's open-loop gain versus frequency. Although an amplifier can be implemented to include a high-frequency feedforward signal compensation path to help compensate for such notches, the high-frequency feedforward signal compensation path may add complexity, increase component count, raise power consumption, and/or not fully compensate for the notch. Furthermore, if an out-of-range signal is applied as an input to such an amplifier, the amplifier's loop may be disturbed and the amplifier may exhibit a relatively slow settling time and/or instability.

Thus, conventional techniques to reduce chopping ripple suffer from a number of drawbacks. Absent compensation, input offset voltage and/or low frequency noise are significant factors that will impair functionality of a precision amplifier. Furthermore, in low power applications it may not be feasible to reduce low frequency noise by operating the amplifier with a higher power consumption or bias current.

Chopper amplifiers with multiple sensing points for correcting input offset are disclosed herein. In certain embodiments, a chopper amplifier includes chopper amplifier circuitry including an input chopping circuit, an amplification circuit, and an output chopping circuit electrically connected in a cascade along a signal path. The chopper amplifier further incudes a multi-point sensed offset correction circuit that generates an input offset compensation signal based on sensing a signal level of the signal path at multiple signal points. Furthermore, the multi-point sensed offset correction circuit injects the input offset compensation signal into the signal path to thereby compensate for input offset voltage of the amplification circuit while suppressing output chopping ripple from arising.

Accordingly, the chopper amplifiers herein can have low input offset voltage when chopping and excellent gain versus frequency characteristics (including at a frequency used for chopping) while avoiding a need for a high-frequency feedforward signal compensation path.

In certain implementations, the multiple signal points include a first signal point along the signal path before the input chopping circuit, and a second signal point along the signal path after the output chopping circuit. Furthermore, in certain implementations, the input offset compensation signal is injected into a portion of the signal path between the amplification circuit and the output chopping circuit.

The multi-point sensed offset correction circuit can be implemented in a wide variety of ways. In certain implementations, the multi-point sensed offset correction circuit can include a first sensing amplifier having an input coupled to a first signal point of the multiple signal points, and a second sensing amplifier having an input coupled to a second signal point of the multiple signal points. Additionally, the output signals from the first and second sensing amplifier can be combined and chopped to generate a combined sense signal. The combined sense signal can be processed using analog and/or digital circuitry to generate the input offset compensation signal.

In certain implementations, digital circuitry is used to process the combined sense signal to generate the input offset compensation signal for the chopper amplifier circuitry. Using digital circuitry can provide a number of advantages.

In a first example, the digital circuitry can include a non-volatile memory for storing digital data representing the input offset voltage of the amplification circuit. Thus, after a power cycle of the chopper amplifier in which the chopper amplifier is powered down and then powered back up, the chopper amplifier can quickly resume precision amplification. In contrast, a chopper amplifier without such a feature can have a long delay at start-up in settling to a steady-state signal value used for input offset compensation.

In a second example, the digital circuitry is coupled to a digital interface (for instance, a serial interface or parallel interface of a semiconductor die or chip), which allows the digital data to be observed off-chip and/or for digital data to be loaded into the chopper amplifier after a power-up to achieve input offset compensation with little to no delay.

In a third example, the digital circuitry can hold input offset correction data for an indefinite amount of time without having a chopping clock signal toggle. Thus, the user can stop and resume the chopping clock signal at any time and after any duration. In contrast, analog circuitry can be subject to leakage currents and/or noise that necessitates the analog circuitry to be regularly operated with the chopping clock signal to maintain proper input offset compensation.

Although the multi-point sensed offset correction circuits herein compensate for input offset voltage of an amplification circuit, the chopping ripple reduction techniques herein can operate to reduce or eliminate low frequency input noise sources and DC offset, including, but not limited to, flicker noise and/or input offset voltage. This in turn leads to reduced output chopping ripple, lower flicker noise current, and/or enhanced spectral output purity of the chopper amplifier.

Figure 1:
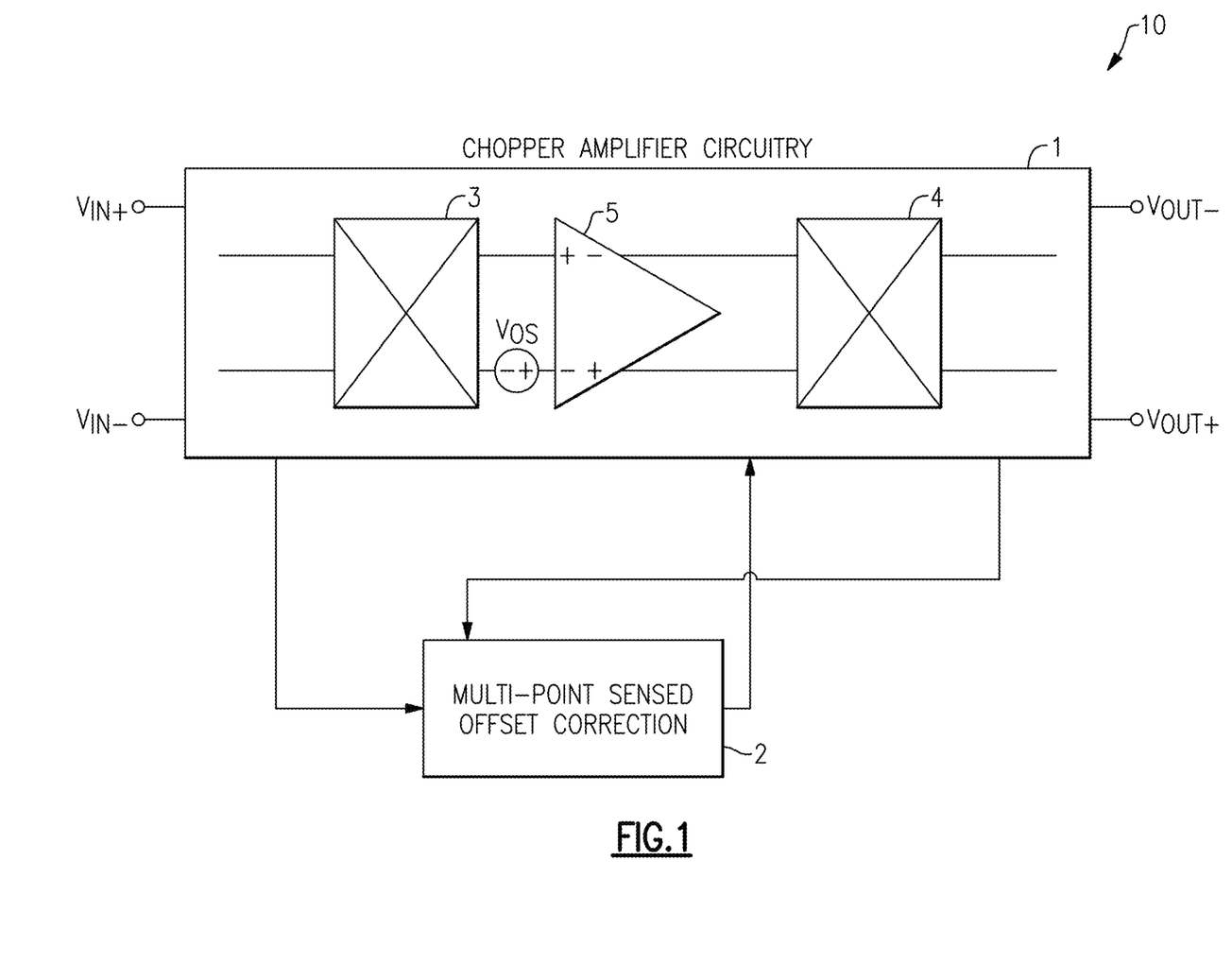
FIG. 1 is a schematic diagram of a chopper amplifier according to one embodiment.

FIG. 1 is a schematic diagram of a chopper amplifier 10 according to one embodiment. The chopper amplifier 10 includes chopper amplifier circuitry 1 and a multi-point sensed offset correction circuit 2 for compensating for an input offset voltage of the chopper amplifier circuitry 1 while suppressing output chopping ripple.

As shown in FIG. 1, the chopper amplifier 10 receives a differential input signal between a positive or non-inverted input voltage terminal $V_{IN+}$ and a negative or inverted input voltage terminal $V_{IN-}$, which operate as a pair of differential input terminals $V_{IN+}$, $V_{IN-}$. The chopper amplifier 10 also outputs a differential output signal between a positive or non-inverted output voltage terminal $V_{IN+}$ and a negative or inverted output voltage terminal $V_{IN-}$, which operate as a pair of differential output terminals $V_{OUT+}$, $V_{OUT-}$.

Although FIG. 1 illustrates a configuration in which the chopper amplifier 10 generates a differential output signal, the chopper amplifier 10 can be adapted to generate other output signals, including, for example, a single-ended output signal. Additionally, although FIG. 1 illustrates the chopper amplifier 10 in an open-loop configuration, the chopper amplifier 10 can be used in closed-loop configurations.

In the illustrated embodiment, the chopper amplifier circuitry 1 includes an input chopping circuit 3, an amplification circuit 5, and an output chopping circuit 4, which are electrically connected in a cascade along a signal path, with the amplification circuit 5 between the input chopping circuit 3 and the output chopping circuit 4. An input offset voltage of the amplification circuit 5 is graphically represented by a voltage source $V_{OS}$, which can have positive or negative polarity.

Although certain components of the chopper amplifier circuitry 1 are shown, the chopper amplifier circuitry 1 can include additional components or circuits, including, but not limited to, one or more additional amplification stages, output stages, feedforward paths, and/or feedback paths. Accordingly, other implementations are possible.

The input chopping circuit 3 operates to chop or modulate the differential input signal to generate a chopped differential input signal, which is amplified by the amplification circuit 5 to generate an amplified differential signal. The amplification circuit 5 can be implemented in a wide variety of ways, and can include one or more amplification stages. The amplified differential input signal is chopped by the output chopping circuit 4, thereby downshifting signal frequency content. The chopped differential output signal can be outputted with or without further processing (for instance, amplification, filtering and/or integration) to generate the differential output signal of the chopper amplifier 10.

The chopper amplifier 10 further includes the multi-point sensed offset correction circuit 2, which senses the signal level of the chopper amplifier circuitry 1 at two or more points or positions along the signal path through the chopper amplifier circuitry 1. Additionally, the multi-point sensed offset correction circuit 2 injects an input offset voltage compensation signal into the signal path of the chopper amplifier circuitry 1 to compensate for input offset voltage and to suppress chopping ripple.

In certain implementations, the multiple signal points include a first signal point along the signal path of the chopper amplifier circuitry 1 before the input chopping circuit 3, and a second signal point along the signal path of the chopper amplifier circuitry 1 after the output chopping circuit 4.

With continuing reference to FIG. 1, the chopping operation of the input chopping circuit 3 upshifts the frequency of the differential input signal. For example, in certain implementations the chopping clock signal of the input chopping circuit 3 is a square wave, which can be equivalently represented by a Fourier series of sine waves at the chopping frequency and at odd harmonics thereof. By modulating the differential input signal by such a square wave, the frequency content of the differential input signal is upshifted.

Accordingly, the chopped differential input signal includes signal content at the chopping frequency and odd harmonics thereof. Thus, the chopped differential input signal is separated in frequency from input offset voltage and/or low frequency noise of the amplification circuit 5.

In certain implementations, the input offset compensation signal is injected into a portion of the signal path of the chopper amplifier circuitry 1 between the amplification circuit 5 and the output chopping circuit 4. By compensating for such low frequency noise prior to output chopping, generation of chopping voltage ripple in the differential output signal is reduced or eliminated. Thus, the noise reduction schemes herein can provide enhanced performance relative to implementations only using post filters after an output chopping circuit to reduce chopping ripple arising from modulation of input offset voltage and/or low frequency noise. Furthermore, robust gain versus frequency characteristics can be achieved without a need for a high frequency feedforward signal compensation path.

Figure 2:
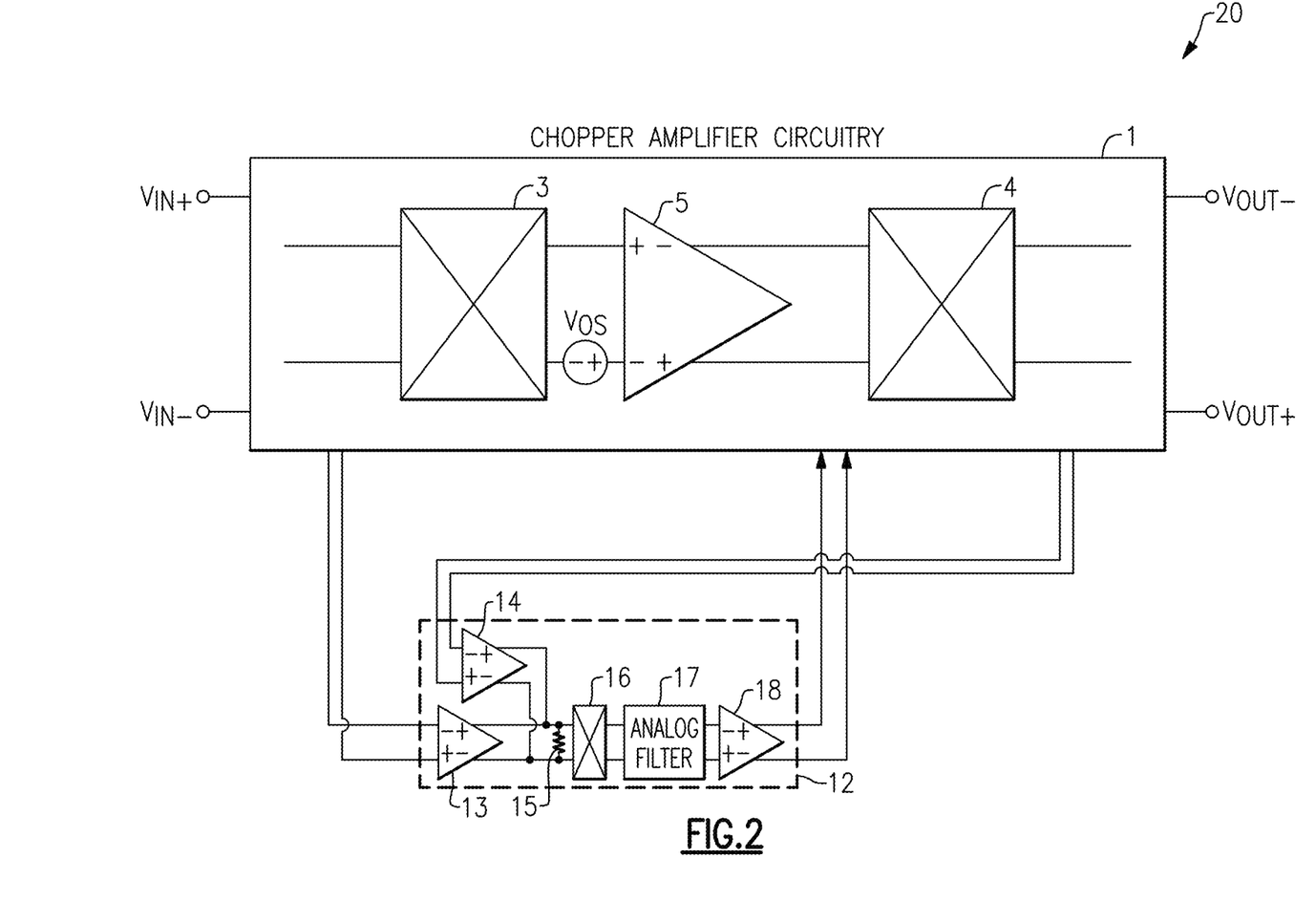
FIG. 2 is a schematic diagram of a chopper amplifier according to another embodiment.

FIG. 2 is a schematic diagram of a chopper amplifier 20 according to another embodiment. The chopper amplifier 20 includes chopper amplifier circuitry 1 and a multi-point sensed offset correction circuit 12.

The chopper amplifier 20 of FIG. 2 is similar to the chopper amplifier 10 of FIG. 1, except that the multi-point sensed offset correction circuit 12 of FIG. 2 includes a first sense amplifier 13, a second sense amplifier 14, a resistor 15, a chopping circuit 16, an analog filter 17, and an output amplifier 18.

In the illustrated embodiment, the first sense amplifier 13 includes a differential input coupled to a first sensing point along the signal path of the chopper amplifier circuitry 1, while the second sense amplifier 14 includes a differential input coupled to a second sensing point along the signal path of the chopper amplifier circuitry 1. In certain implementations, the first sensing point is before the input chopping circuit 3, while the second sensing point is after the output chopping circuit 4.

The first sense amplifier 13 and the second sense amplifier 14 can each include one or more stages. In certain implementations, an input stage of the first sense amplifier 13 is a replica of the amplification circuit 5, with or without scaling.

As shown in FIG. 2, an output signal from the first sense amplifier 13 and an output signal from the second sense amplifier 14 are combined, and thereafter chopped using the chopping circuit 16 to generate a combined sense signal that is inputted to the analog filter 17. In certain implementations, the output signal from the first sense amplifier 13 and the output signal from the second sense amplifier 14 correspond to currents that flow through the resistor 15 to generate an input voltage signal for the chopping circuit 16.

With continuing reference to FIG. 2, the analog filter 17 filters the combined sense signal to generate a filtered signal, which is amplified by the output amplifier 18 to generate a differential input offset compensation signal provided to the chopper amplifier circuitry 1. In certain implementations, the differential input offset compensation signal is provided to a differential output of the amplification circuit 5 to compensate for the input offset voltage $V_{OS}$ of the amplification circuit 5.

Figure 3A:
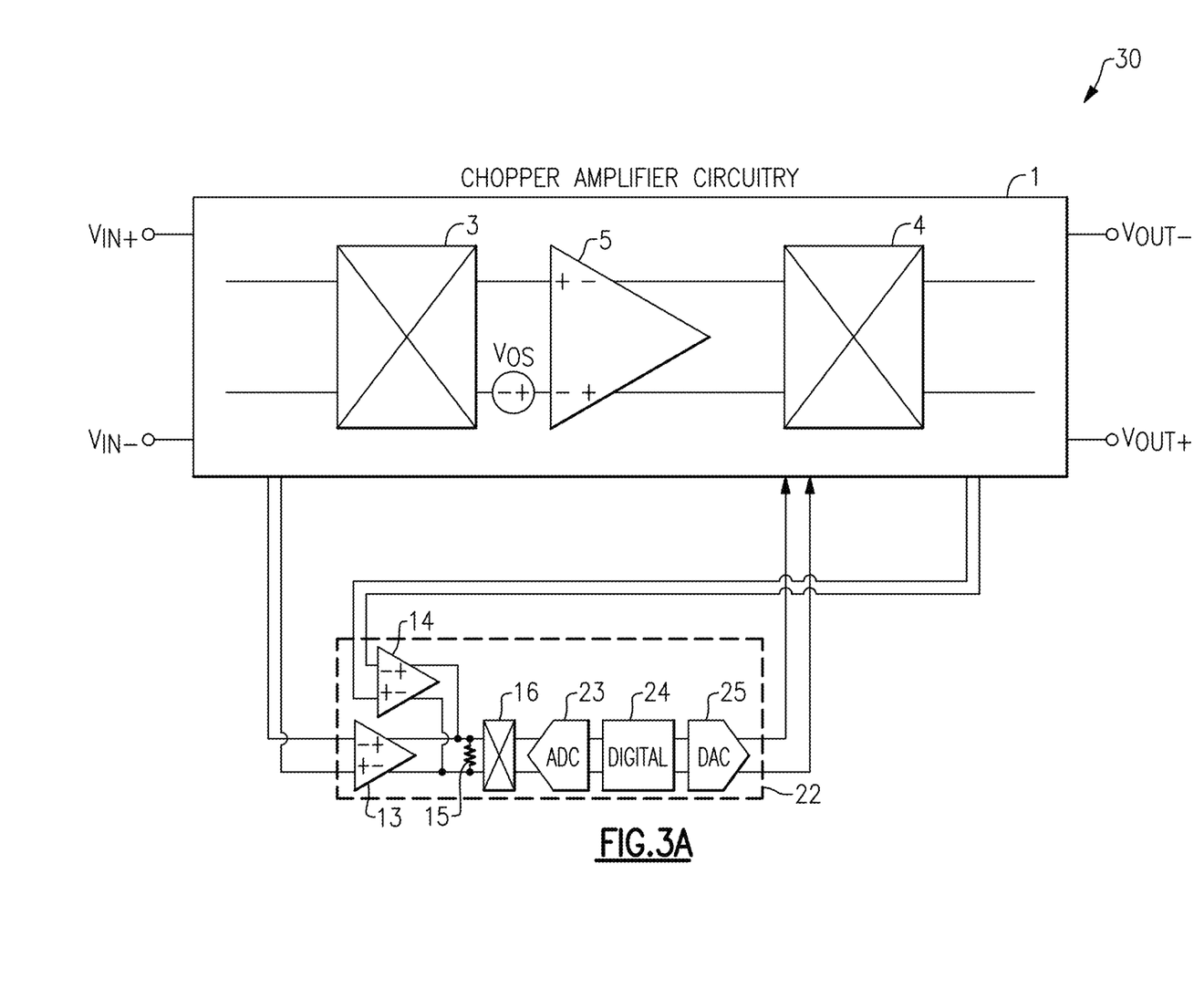
FIG. 3A is a schematic diagram of a chopper amplifier according to another embodiment.

FIG. 3A is a schematic diagram of a chopper amplifier 30 according to another embodiment. The chopper amplifier 30 includes chopper amplifier circuitry 1 and a multi-point sensed offset correction circuit 22.

The chopper amplifier 30 of FIG. 3A is similar to the chopper amplifier 20 of FIG. 2, except that the multi-point sensed offset correction circuit 22 of FIG. 3A includes an analog-to-digital converter (ADC) 23, a digital circuit 24, and a digital-to-analog converter (DAC) 25 instead of the analog filter 17 and the output amplifier 18 shown in FIG. 2.

Accordingly, in the embodiment of FIG. 3A, the combined sense signal outputted from the chopping circuit 16 is digitized by the ADC 23. Additionally, the digital circuit 24 performs digital filtering, digital accumulation, and/or other digital processing to generate processed digital data for the DAC 25. Furthermore, the DAC 25 outputs the differential input offset compensation signal.

Figure 3B:
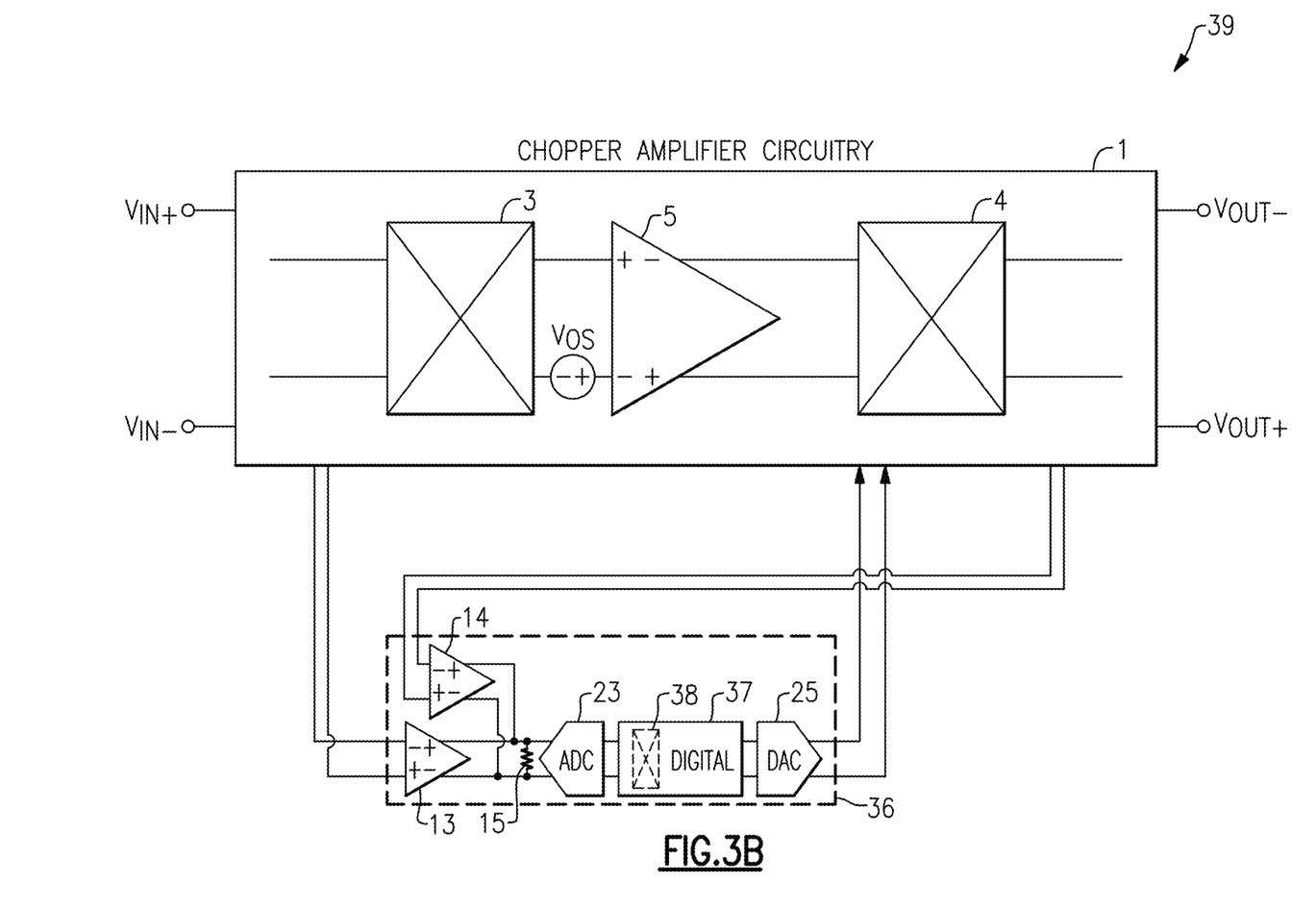
FIG. 3B is a schematic diagram of a chopper amplifier according to another embodiment.

FIG. 3B is a schematic diagram of a chopper amplifier 39 according to another embodiment. The chopper amplifier 39 includes chopper amplifier circuitry 1 and a multi-point sensed offset correction circuit 36.

The chopper amplifier 39 of FIG. 3B is similar to the chopper amplifier 30 of FIG. 3A, except that the multi-point sensed offset correction circuit 36 of FIG. 3B omits the chopping circuit 16 shown in FIG. 3A. Additionally, the multi-point sensed offset correction circuit 36 includes a digital circuit 37 that provides digital chopping 38. Any of the multi-point sensed offset correction circuits herein can be adapted to operate with digital chopping.

Figure 4:
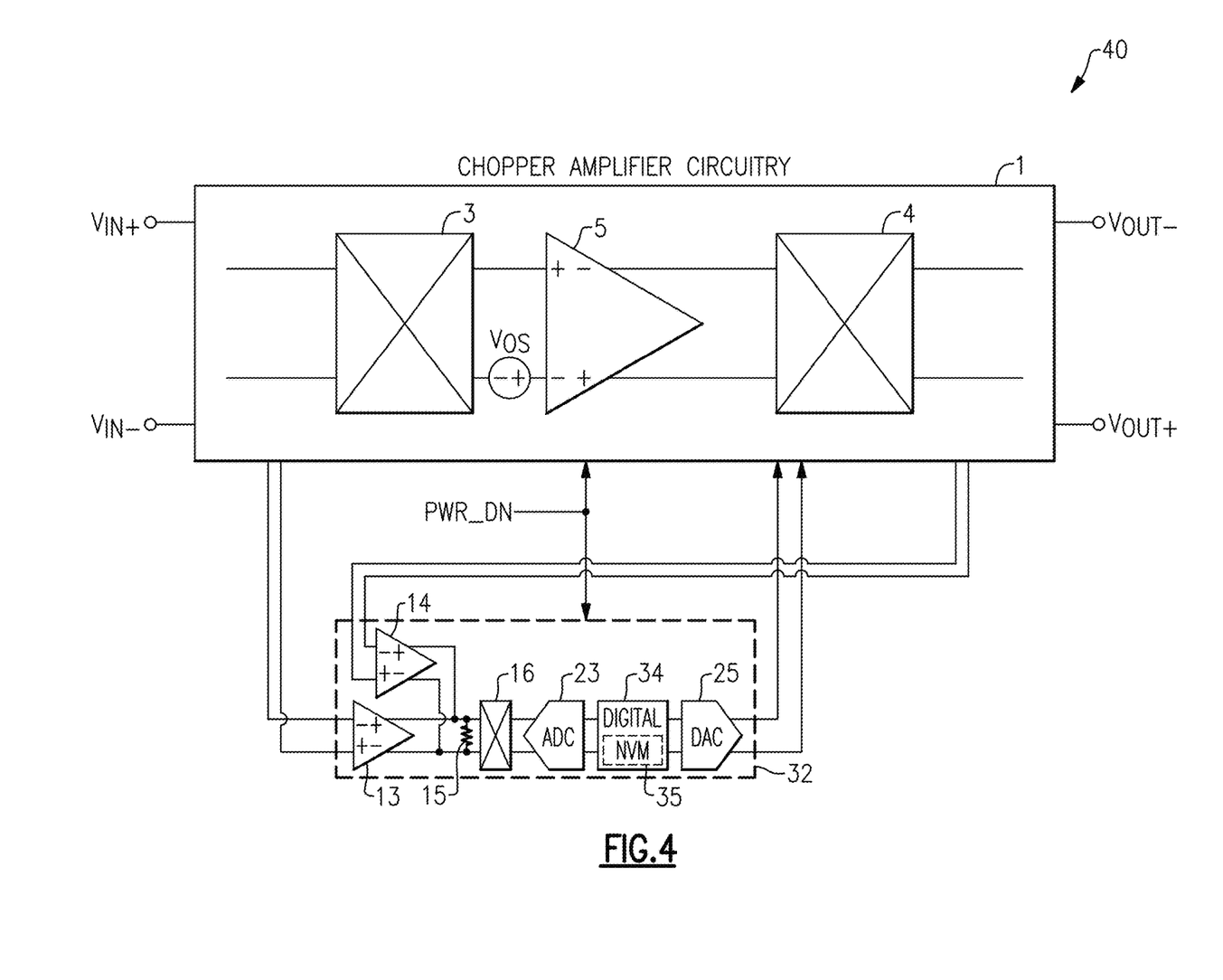
FIG. 4 is a schematic diagram of a chopper amplifier according to another embodiment.

FIG. 4 is a schematic diagram of a chopper amplifier 40 according to another embodiment. The chopper amplifier 40 includes chopper amplifier circuitry 1 and a multi-point sensed offset correction circuit 32.

The chopper amplifier 40 of FIG. 4 is similar to the chopper amplifier 30 of FIG. 3A, except that the multi-point sensed offset correction circuit 32 of FIG. 4 includes a digital circuit 34 that includes a non-volatile memory (NVM) 35. The NVM 35 is used to store digital data indicating a signal value of the differential input offset compensation signal.

By including the NVM 35, the chopper amplifier 40 can quickly resume amplification after a power cycle. Such a power cycle can correspond to a ramp down and ramp up of the chopper amplifier's supply voltage, and/or a power down signal (PWR_DN) can be used to turn on and off the chopper amplifier 40. By including the NVM 35, data indicating the signal value for input offset compensation is not lost during the power cycle. Thus, a start-up delay in settling to a steady-state signal value for input offset compensation is avoided.

Figure 5:
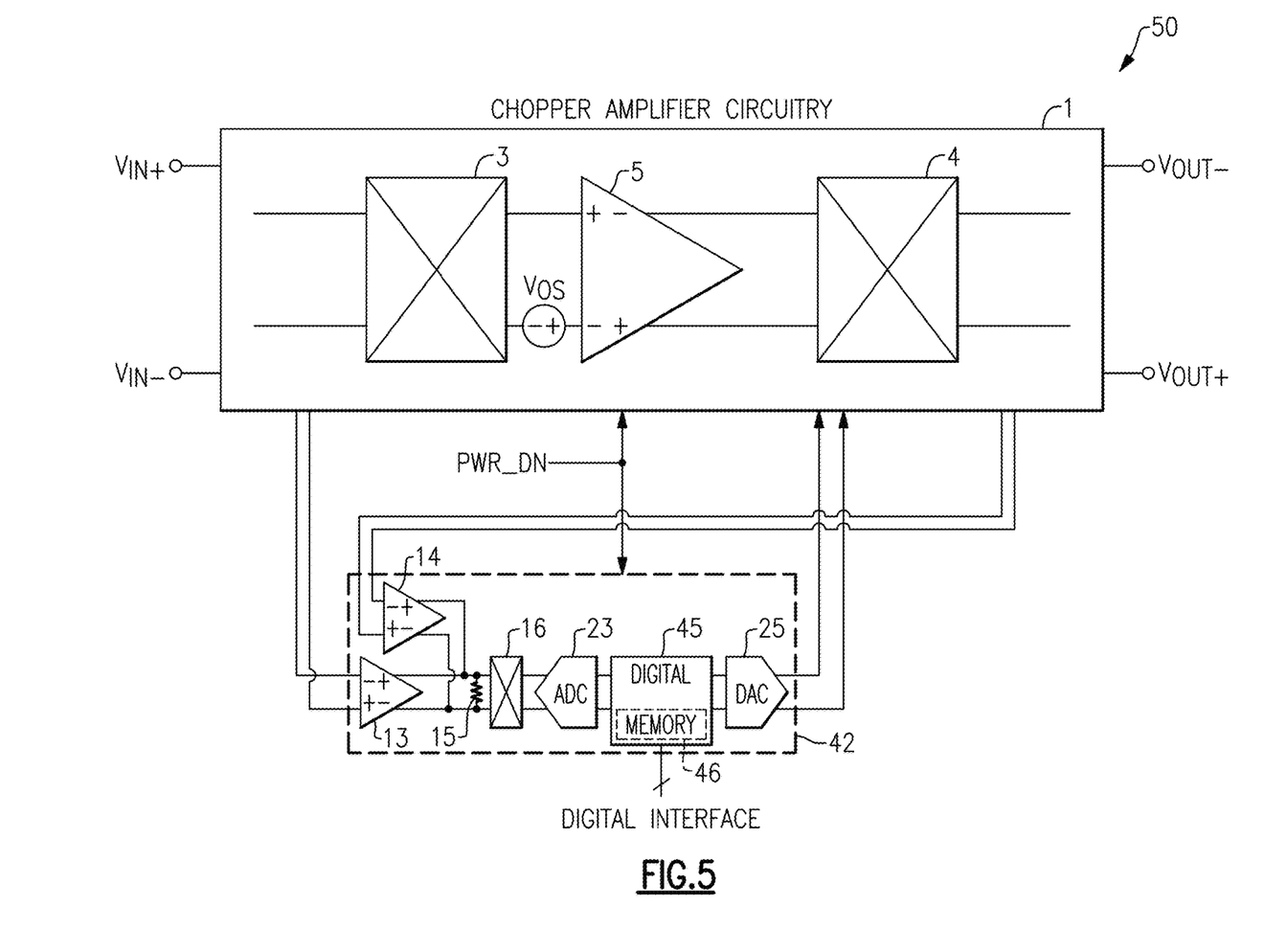
FIG. 5 is a schematic diagram of a chopper amplifier according to another embodiment.

FIG. 5 is a schematic diagram of a chopper amplifier 50 according to another embodiment. The chopper amplifier 50 includes chopper amplifier circuitry 1 and a multi-point sensed offset correction circuit 42.

The chopper amplifier 50 of FIG. 5 is similar to the chopper amplifier 30 of FIG. 3A, except that the multi-point sensed offset correction circuit 42 of FIG. 5 includes a digital circuit 45 coupled to a digital interface and that includes a memory 46, which can be volatile or non-volatile. The memory 46 is used to store digital data indicating a signal value of the differential input offset compensation signal, and can be read from or written to using the digital interface, which can correspond to a serial interface or parallel interface of a semiconductor chip on which the chopper amplifier 50 is fabricated.

Implementing the digital circuit 45 to communicate over the digital interface allows the digital data to be observed off-chip and/or for digital data to be loaded into the chopper amplifier 50 after power-up or a power cycle to achieve input offset compensation with little to no delay.

Figure 6:
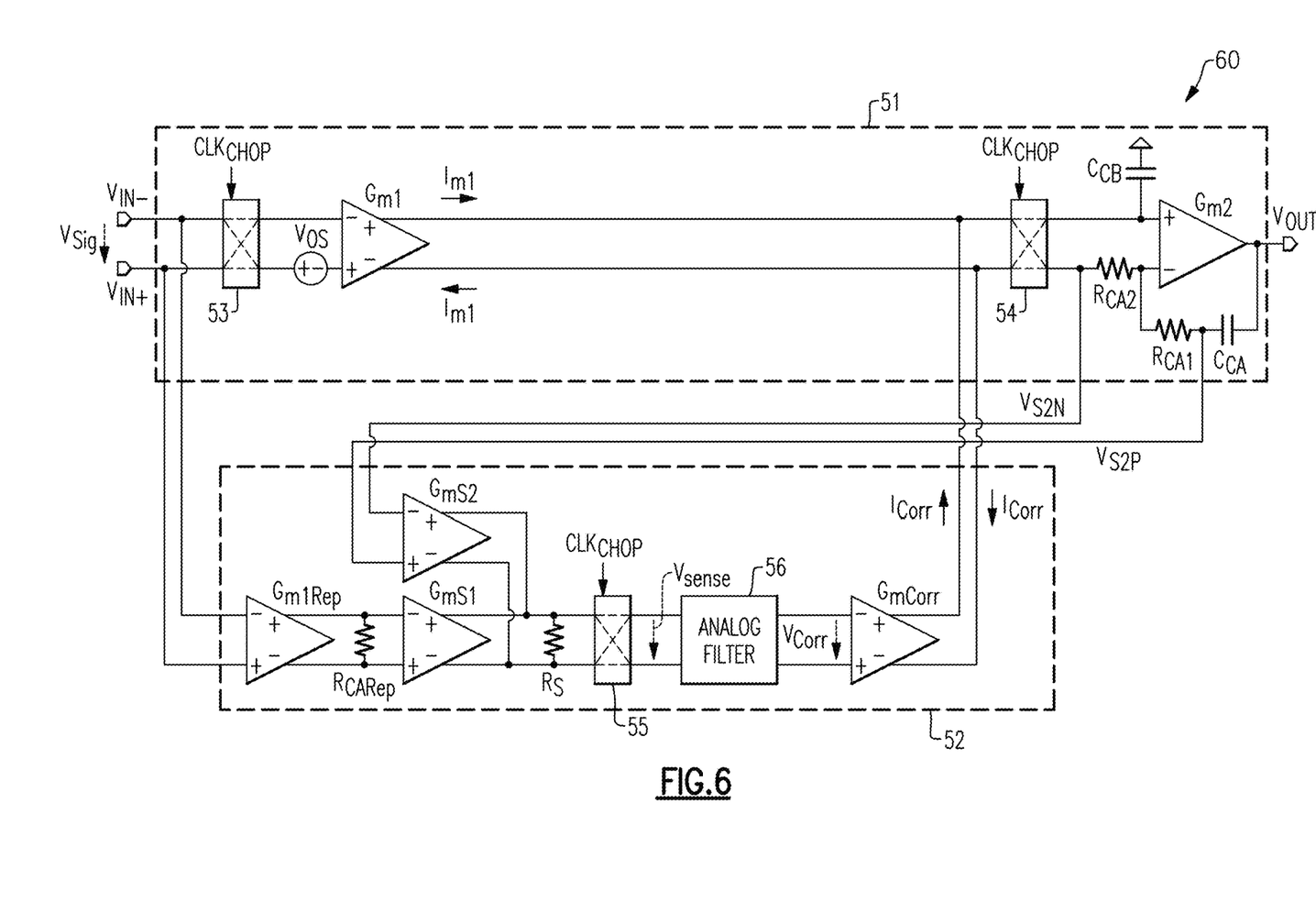
FIG. 6 is a schematic diagram of a chopper amplifier according to another embodiment.

FIG. 6 is a schematic diagram of a chopper amplifier 60 according to another embodiment. The chopper amplifier 60 includes chopper amplifier circuitry 51 and a multi-point sensed offset correction circuit 52. The chopper amplifier 60 further includes a pair of differential input terminals $V_{IN+}$, $V_{IN-}$ for receiving a differential input voltage $V_{Sig}$, and a single-ended output terminal $V_{OUT}$ for outputting a single-ended output voltage.

In the illustrated embodiment, the chopper amplifier circuitry 51 includes an input chopping circuit 53 (controlled by a chopping clock signal $CLK_{CHOP}$), a first transconductance amplifier $G_{m1}$ (having an input offset voltage represented by a voltage source $V_{OS}$ and outputting a differential signal current $I_{m1}$), an output chopping circuit 54 (controlled by the chopping clock signal $CLK_{CHOP}$), a second transconductance amplifier $G_{m2}$, a first resistor $R_{CA1}$, a second resistor $R_{CA2}$, a first capacitor $C_{CA}$, and a second capacitor $C_{CB}$.

Although one embodiment of chopper amplifier circuitry 51 is depicted, the teachings herein are applicable to chopper amplifier circuitry implemented in a wide variety of ways. Accordingly, other implementations are possible.

With continuing reference to FIG. 6, the multi-point sensed offset correction circuit 52 incudes a replica transconductance amplifier $G_{m1Rep}$, which corresponds to a replica of the first transconductance amplifier $G_{m1}$, with or without scaling. The multi-point sensed offset correction circuit 52 further includes a first resistor $R_{CARep}$, which corresponds to a replica of the series combination of the first resistor $R_{CA1}$ and the second resistor $R_{CA2}$, with or without scaling. The multi-point sensed offset correction circuit 52 further includes a first sense transconductance amplifier $G_{m}si$, a second sense transconductance amplifier $G_{mS2}$, a second resistor $R_S$, a chopper circuit 55 (controlled by the chopping clock signal $CLK_{CHOP}$), an analog filter 56 (receiving a sense voltage $V_{sense}$ and outputting a correction voltage $V_{Corr}$), and an output transconductance amplifier $G_{mCorr}$ (outputting a differential correction current $I_{Corr}$).

As shown in FIG. 6, the multi-point sensed offset correction circuit 52 senses the signal path of the chopper amplifier circuitry 51 at both a differential input to the input chopping circuit 53 and across the series combination of the first resistor $R_{CA1}$ and the second resistor $R_{CA2}$ (corresponding to a voltage difference between $V_{S2P}$ and $V_{S2N}$). Additionally, the multi-point sensed offset correction circuit 52 injects the differential correction current $I_{Corr}$ into the chopper amplifier circuitry 51 such that the differential correction current $I_{Corr}$ is combined with the differential signal current $I_{m1}$.

Although one embodiment of the multi-point sensed offset correction circuit 52 is depicted, the teachings herein are applicable to the multi-point sensed offset correction circuits implemented in a wide variety of ways. Accordingly, other implementations are possible.

As shown in FIG. 6, the sense voltage $V_{sense}$ is provided from the chopping circuit 55 to the analog filter 56. When $V_{Sig}=0$ mV and $V_{OS}$ is not 0 mV, one expression for $V_{sense}$ is given by Equation 1 below, wherein $\alpha_{FB}$ is a feedback parameter between 0 and 1 and $R_{CA}=R_{CA1}+R_{CA2}$.

$$V_{sense} = \alpha_{FB} * V_{OS} * (G_{m1Rep} R_{CARep}) * (G_{mS1} R_S) + (1-\alpha_{FB})$$
$$* V_{OS} * (G_{m1} R_{CA}) * (G_{mS1} R_S) \quad \text{Equation 1}$$

By setting $G_{m1Rep} * R_{CARep} = G_{m1} * R_{CA}$, $V_{sense}$ is given by Equation 2 below.

$$V_{sense} = V_{OS} * (G_{m1} R_{CA}) * (G_{mS1} R_S) \quad \text{Equation 2}$$

As shown in Equation 2, the offset voltage $V_{OS}$ is sensed by $V_{sense}$, since $V_{sense}$ is proportional to $V_{OS}$.

On the other hand, when $V_{Sig}$ is not 0 mV and $V_{OS}$ is 0 mV, $V_{sense}$ is given by Equation 3 below.

$$V_{sense} = V_{sig} * (G_{m1Rep} R_{CARep}) * (G_{mS1} R_S) - V_{Sig} *$$
$$(G_{m1} R_{CA}) * (G_{mS1} R_S) \quad \text{Equation 3}$$

By setting $G_{m1Rep} * R_{CARep} = G_{m1} * R_{CA}$, $V_{sense}$ is about 0 mV. Accordingly, $V_{Sig}$ does not affect $V_{sense}$.

Figure 7:
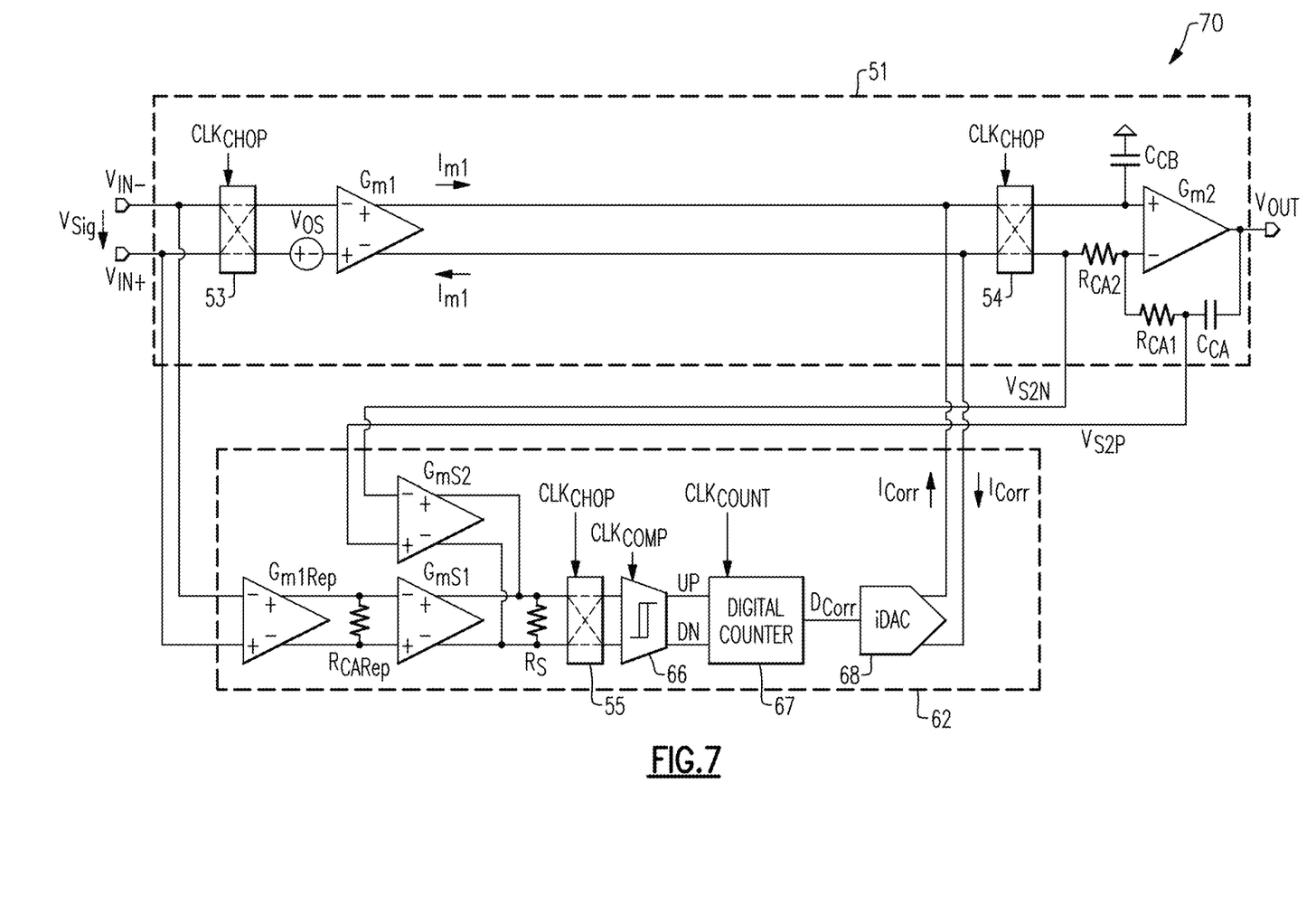
FIG. 7 is a schematic diagram of a chopper amplifier according to another embodiment.

FIG. 7 is a schematic diagram of a chopper amplifier 70 according to another embodiment. The chopper amplifier 70 includes chopper amplifier circuitry 51 and a multi-point sensed offset correction circuit 62.

The chopper amplifier 70 of FIG. 7 is similar to the chopper amplifier 60 of FIG. 6, except that the multi-point sensed offset correction circuit 62 of FIG. 7 includes a comparator 66, a digital counter 67, and a current DAC (iDAC) 68 rather than the analog filter 56 and output transconductance amplifier $G_{mCorr}$ shown in FIG. 6. The comparator 66 serves as a 1-bit ADC that generates an up signal UP and a down signal DN for controlling a state of the digital counter 67. The digital counter 67 outputs digital correction data $D_{Corr}$, which the current DAC 68 uses to generate the differential correction current $I_{Corr}$.

In the illustrated embodiment, the chopping circuit 55 is clocked by the chopping clock signal $CLK_{CHOP}$, while the comparator 66 is clocked by the comparator clock signal $CLK_{COMP}$ and the digital counter 67 is clocked by the counter clock signal $CLK_{COMP}$. In certain implementations, the comparator clock signal $CLK_{COMP}$ and/or the counter clock signal $CLK_{COMP}$ are generated by delaying the chopping clock signal $CLK_{CHOP}$ or a divided version thereof. In the example of FIG. 7, the current DAC 68 responds to a change in the digital correction data $D_{Corr}$ rather than being driven by a clock signal. Although one example of clocking is depicted, a multi-point sensed offset correction circuit can be clocked in a wide variety of ways.

Although one embodiment of the multi-point sensed offset correction circuit 62 is depicted, the teachings herein are applicable to the multi-point sensed offset correction circuits implemented in a wide variety of ways. Accordingly, other implementations are possible.

Figure 8:
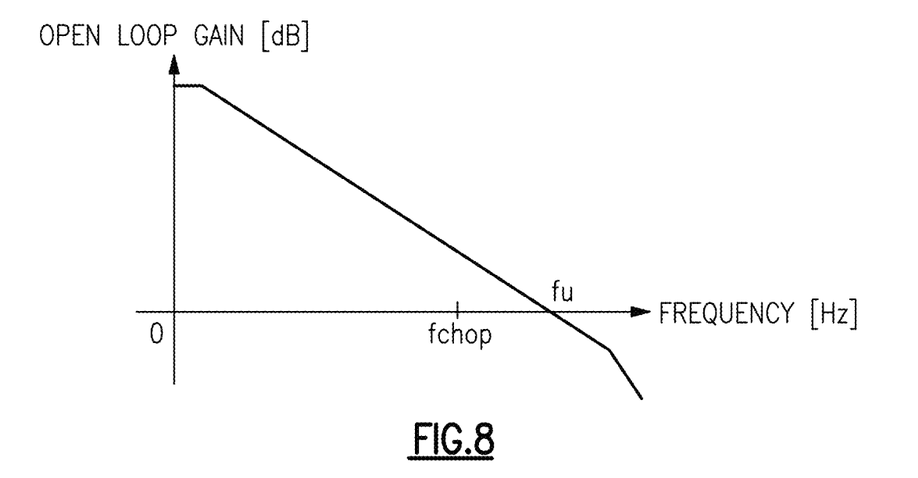
FIG. 8 is a graph of open loop gain versus frequency for a chopper amplifier according to one embodiment.

FIG. 8 is a graph of open loop gain versus frequency for a chopper amplifier according to one embodiment. As shown in FIG. 8, the chopper amplifier exhibits little to no notching in gain near the chopping frequency (fchop). Moreover, such robust gain versus frequency characteristics can be achieved without a need for a high frequency feedforward signal compensation path, which can add complexity, increase component count, and/or raise power consumption.

Figure 9:
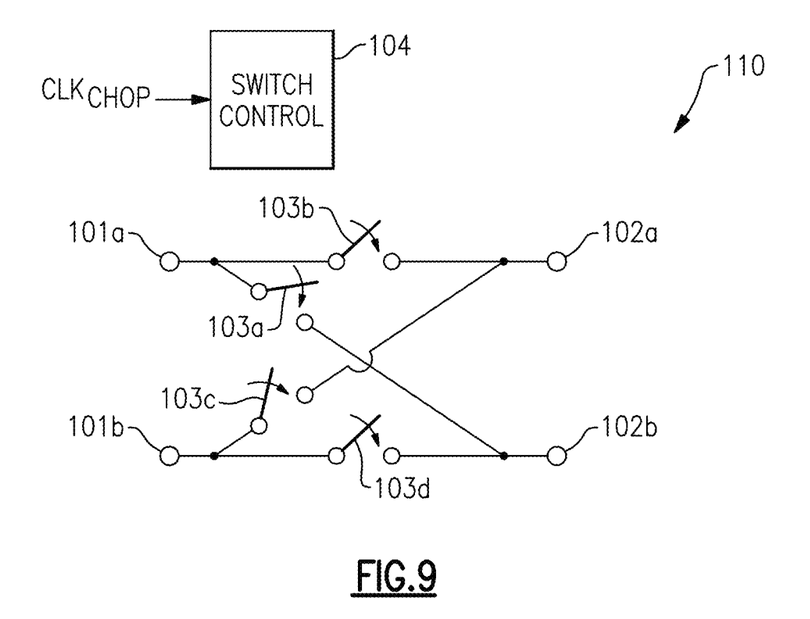
FIG. 9 is a schematic diagram of one example of a chopping circuit that can be used in a chopper amplifier.

FIG. 9 is a schematic diagram of one example of a chopping circuit 110 that can be used in a chopper amplifier. The chopping circuit 110 illustrates one implementation of a chopping circuit that can be used in the chopper amplifiers herein. However, chopping circuits can be implemented in other ways.

As shown in FIG. 9, the chopping circuit 100 includes first and second inputs 101a, 101b that operate as a differential input, first and second outputs 102a, 102b that operate as a differential output, first to fourth switches 103a-103d, and a switch control circuit 104. As shown in FIG. 9, the switch control circuit 104 receives a chopping clock signal $CLK_{CHOP}$, which can be used to control a state of the switches 103a-103d over time. Although illustrated as including the switch control circuit 104, in certain configurations the switch control circuit 104 is omitted in favor of providing multiple clock signals (for example, inverted and non-inverted versions of a chopping clock signal, with or without non-overlap) to the chopping circuit 110.

The first input 101a is electrically connected to a first end of the first switch 103a and to a first end of the second switch 103b. The second input 101b is electrically connected to a first end of the third switch 103c and to a first end of the fourth switch 103d. The first output 102a is electrically connected to a second end of the second switch 103b and to a second end of the third switch 103c. The second output 102b is electrically connected to a second end of the first switch 103a and to a second end of the fourth switch 103d.

The chopping circuit 110 can be used to chop a differential input signal received between the first and second inputs 101a, 101b to generate a differential chopped signal between the first and second outputs 102a, 102b. For example, during a first clock phase of the chopping clock signal $CLK_{CHOP}$, the switch control circuit 104 can close the second and fourth switches 103b, 103d and open the first and third switches 103a, 103c. Additionally, during a second clock phase of the chopping clock signal $CLK_{CHOP}$, the switch control circuit 104 can close the first and third switches 103a, 103c and open the second and fourth switches 103b, 103d.

The clock signals disclosed herein can be implemented in a wide variety of ways, including, for example, by using any suitable clock generator. In certain implementations, a common clock signal is used to synthesize clock signals used for chopping, auto-zeroing, digital processing, and/or other operations of a chopper amplifier.

Applications

Devices employing the above described schemes can be implemented into various electronic devices. Examples of electronic devices include, but are not limited to, consumer electronic products, electronic test equipment, communication systems, data converters, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A chopper amplifier with chopping ripple suppression, the chopper amplifier comprising:
   chopper amplifier circuitry comprising:
      an input chopping circuit configured to chop an input signal to generate a chopped input signal;
      an amplification circuit configured to amplify the chopped input signal to generate an amplified signal;
      an output chopping circuit configured to chop the amplified signal to generate a chopped output signal, wherein the input chopping circuit, the amplification circuit, and the output chopping circuit are connected along a signal path through the chopper amplifier circuitry;
      an output stage coupled to the output chopping circuit; and
      a first resistor connected along a feedback path between an output of the output stage and a first input of the output stage; and
   a multi-point sensed offset correction circuit configured to generate an input offset compensation signal for the chopper amplifier circuitry based on sensing the signal path at two or more signal points, wherein the multi-point sensed offset correction circuit comprises a first sense amplifier having an input coupled to a first signal point of the two or more signal points, and a second sense amplifier having an input coupled to the first resistor at a second signal point of the two or more signal points.

2. The chopper amplifier of claim 1, wherein the first signal point is before the input chopping circuit.

3. The chopper amplifier of claim 1, wherein the multi-point sensed offset correction circuit is configured to provide the input offset compensation signal to an output of the amplification circuit.

4. The chopper amplifier of claim 1 wherein the first sense amplifier is a replica of the amplification circuit.

5. The chopper amplifier of claim 1 further comprising a pair of input terminals configured to provide the input signal to the input chopping circuit, wherein the input of the first sense amplifier comprises a differential input coupled across the pair of input terminals.

6. The chopper amplifier of claim 1 wherein the chopper amplifier circuitry further comprises a second resistor coupled between a first output of the output chopping circuit and the first input of the output stage, wherein the input of the second sense amplifier comprises a differential input coupled across the first resistor and the second resistor.

7. A chopper amplifier with chopping ripple suppression, the chopper amplifier comprising:
   chopper amplifier circuitry comprising:
      an input chopping circuit configured to chop an input signal to generate a chopped input signal;
      an amplification circuit configured to amplify the chopped input signal to generate an amplified signal; and
      an output chopping circuit configured to chop the amplified signal to generate a chopped output signal, wherein the input chopping circuit, the amplification circuit, and the output chopping circuit are connected along a signal path through the chopper amplifier circuitry; and
   a multi-point sensed offset correction circuit configured to generate an input offset compensation signal for the chopper amplifier circuitry based on sensing the signal path at two or more signal points, wherein the multi-point sensed offset correction circuit comprises a first sense amplifier having an input coupled to a first signal point of the two or more signal points, a second sense amplifier having an input coupled to a second signal point of the two or more signal points, a chopping circuit configured to generate a sense signal based on chopping a combined output signal of the first sense amplifier and the second sense amplifier, an analog low-pass filter configured to filter the sense signal to generate a correction signal, and an output amplifier configured to amplify the correction signal to generate the input offset compensation signal.

8. The chopper amplifier of claim 7, wherein the multi-point sensed offset correction circuit is configured to provide the input offset compensation signal to an output of the amplification circuit.

9. The chopper amplifier of claim 7 wherein the first sense amplifier is a replica of the amplification circuit.

10. The chopper amplifier of claim 7 wherein the first sense amplifier is a first transconductance amplifier and the second sense amplifier is a second transconductance amplifier, the multi-point sensed offset correction circuit further comprising a resistor coupled across a differential input of the chopping circuit of the multi-point sensed offset correction circuit.

11. The chopper amplifier of claim 7, wherein the first signal point is before the input chopping circuit.

12. The chopper amplifier of claim 11, wherein the second signal point is after the output chopping circuit.

13. A chopper amplifier with chopping ripple suppression, the chopper amplifier comprising:
   chopper amplifier circuitry comprising:
      an input chopping circuit configured to chop an input signal to generate a chopped input signal;
      an amplification circuit configured to amplify the chopped input signal to generate an amplified signal; and
      an output chopping circuit configured to chop the amplified signal to generate a chopped output signal, wherein the input chopping circuit, the amplification circuit, and the output chopping circuit are connected along a signal path through the chopper amplifier circuitry; and
   a multi-point sensed offset correction circuit configured to generate an input offset compensation signal for the chopper amplifier circuitry based on sensing the signal path at two or more signal points, wherein the multi-point sensed offset correction circuit comprises a first sense amplifier having an input coupled to a first signal point of the two or more signal points, a second sense amplifier having an input coupled to a second signal point of the two or more signal points, and wherein the multi-point sensed offset correction circuit is configured to generate a sense signal based on an output signal of the first sense amplifier and an output signal of the second sense amplifier, the multi-point sensed offset correction circuit further comprising an analog-to-digital converter configured to convert the sense signal into a digital input signal, a digital circuit configured to process the digital input signal to generate a digital correction signal, and a digital-to-analog converter configured to control the input offset compensation signal based on the digital correction signal.

14. The chopper amplifier of claim 13, wherein the multi-point sensed offset correction circuit further comprises a chopping circuit configured to generate the sense signal based on chopping a combined output signal of the first sense amplifier and the second sense amplifier.

15. The chopper amplifier of claim 13, wherein the analog-to-digital converter comprises a comparator, and the digital circuit comprises a counter.

16. The chopper amplifier of claim 13, wherein the digital circuit comprises a non-volatile memory configured to store data indicating a value of the digital correction signal.

17. The chopper amplifier of claim 13, wherein the digital circuit comprises a memory configured to store data indicating a value of the digital correction signal, wherein the digital circuit is coupled to digital interface operable to read or write the memory.

18. The chopper amplifier of claim 13, wherein the first signal point is before the input chopping circuit.

19. The chopper amplifier of claim 18, wherein the second signal point is after the output chopping circuit.

20. The chopper amplifier of claim 13, wherein the multi-point sensed offset correction circuit is configured to provide the input offset compensation signal to an output of the amplification circuit.

* * * * *